US006870221B2

(12) United States Patent
Venkatraman

(10) Patent No.: US 6,870,221 B2
(45) Date of Patent: Mar. 22, 2005

(54) POWER SWITCHING TRANSISTOR WITH LOW DRAIN TO GATE CAPACITANCE

(75) Inventor: Prasad Venkatraman, Gilbert, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 10/313,225

(22) Filed: Dec. 9, 2002

(65) Prior Publication Data

US 2004/0108547 A1 Jun. 10, 2004

(51) Int. Cl.[7] .......................... H01L 29/76; H01L 29/94
(52) U.S. Cl. ..................................... 257/341; 257/342
(58) Field of Search ........................... 257/335, 341, 257/342

(56) References Cited

U.S. PATENT DOCUMENTS

| 4,376,286 A | 3/1983 | Lidow et al. |
| 4,593,302 A | 6/1986 | Lidow et al. |
| 4,642,666 A | 2/1987 | Lidow et al. |
| 4,680,853 A | 7/1987 | Lidow et al. |
| 4,705,759 A | 11/1987 | Lidow et al. |
| 4,789,882 A | 12/1988 | Lidow |
| 4,959,699 A | 9/1990 | Lidow et al. |
| 4,974,059 A | * 11/1990 | Kinzer ........................ 257/342 |
| 5,008,725 A | 4/1991 | Lidow et al. |
| 5,130,767 A | 7/1992 | Lidow et al. |
| 5,191,396 A | 3/1993 | Lidow et al. |
| 5,338,961 A | 8/1994 | Lidow et al. |
| 5,396,097 A | * 3/1995 | Robb et al. .................. 257/341 |
| 6,262,453 B1 | * 7/2001 | Hshieh ........................ 257/341 |

FOREIGN PATENT DOCUMENTS

| EP | 0050773 | 9/1981 | ............ H01I/29/60 |
| EP | 0586835 | 3/1984 | ........... H01L/29/60 |
| EP | 0119400 | 9/1984 | ........... H01L/29/78 |

* cited by examiner

Primary Examiner—Steven Loke
(74) Attorney, Agent, or Firm—James J. Stipanuk

(57) ABSTRACT

A transistor (10) is formed on a semiconductor substrate (12) with a first surface (19) for forming a channel (40). A gate dielectric (22) has a first thickness overlying a first portion of the channel, and a dielectric film (20) overlies a second portion of the channel and has a second thickness greater than the first thickness. The second thickness reduces the drain to gate capacitance of the transistor, thereby improving its switching speed and frequency response.

8 Claims, 2 Drawing Sheets

US 6,870,221 B2

POWER SWITCHING TRANSISTOR WITH LOW DRAIN TO GATE CAPACITANCE

BACKGROUND OF THE INVENTION

The present invention relates in general to semiconductor devices and, more particularly, to vertical MOS power transistors.

Switching regulators achieve a high efficiency by using a transistor to switch current through an inductor or transformer to generate a regulated output voltage. One type of switching transistor often used in switching regulators is a power double diffused metal-oxide-semiconductor (DMOS) transistor. A DMOS transistor typically is a vertical transistor in which current flows laterally through a plurality of electrically parallel channels formed along the top surface of a semiconductor die to a common drain, and then vertically through the drain to a drain electrode formed at the bottom surface of the die.

Existing DMOS transistors have the drawback of a high drain to gate capacitance, which Slows down the switching and reduces the efficiency of the transistor and/or system. As a result, the switching regulators have a low efficiency and the transistor has a high heat dissipation and reduced reliability. In order to achieve a small die size and low cost, the gate electrode is formed over a thin dielectric layer and routed over portions of the common drain that lie at the top surface. The overlap of the gate electrode and common drain generates a substantial portion of the overall drain to gate capacitance and results in a reduction in the switching speed and frequency response of the switching power transistor.

Hence, there is a need for a power transistor that has a low drain to gate capacitance in order to switch at a higher speed to reduce power dissipation and increase reliability.

DETAILED DESCRIPTION OF THE DRAWINGS

In the figures, elements having the same reference number have similar functionality.

Figure 1:
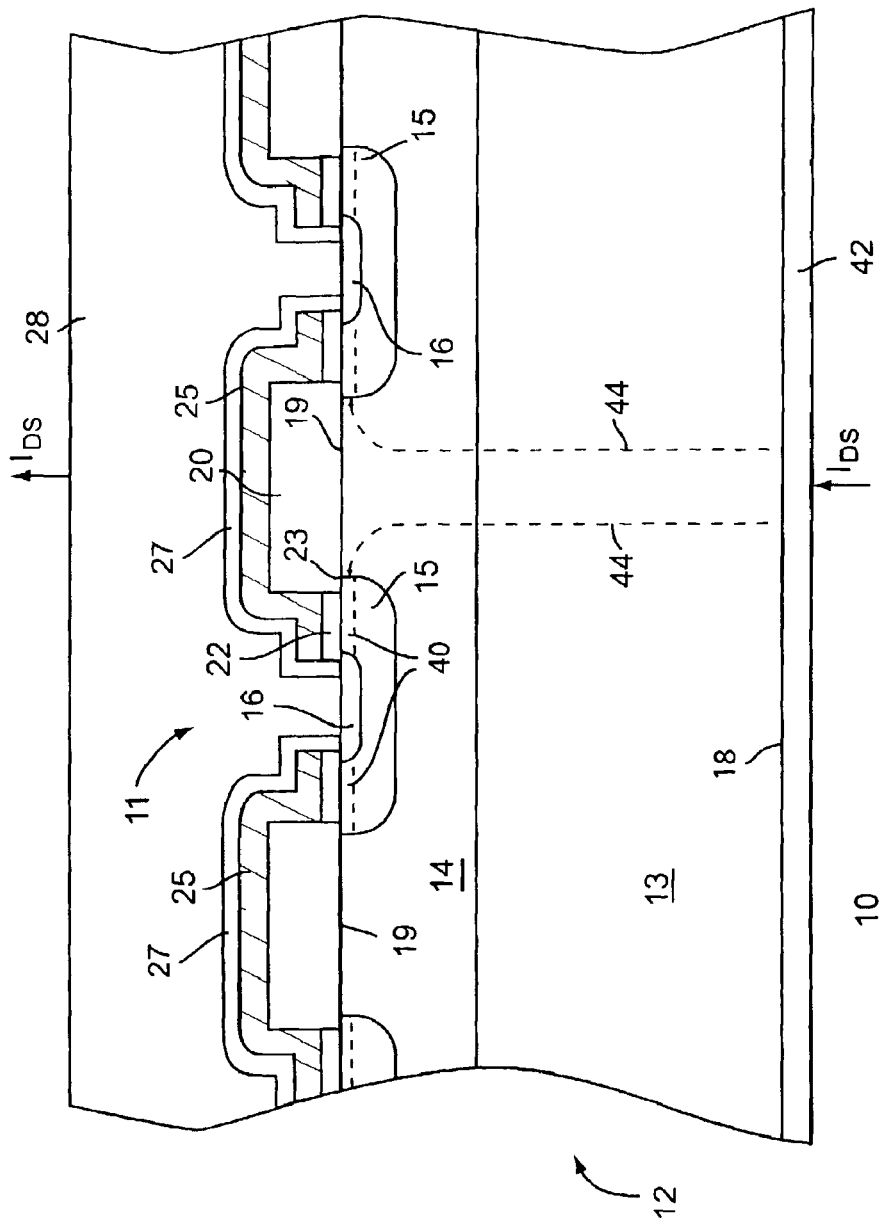
FIG. 1 is a cross-sectional view of a vertical power transistor.

FIG. 1 is a cross-sectional view of a vertical power transistor 10 formed on a semiconductor substrate 12 and configured as a double-diffused metal-oxide semiconductor (MOS) transistor. A plurality of unit cells 11 typically are connected on a horizontal top surface 19 of substrate 12 to form an array of rows, columns, cells or similar patterns. Alternatively, transistor 10 may be formed as a single, continuous serpentine or branched layout. Each unit cell 11 includes two channels 40 running along top surface 19 and formed by inverting portions of a well region 15. Channels 40 are parallel-connected as described below and also coupled to other channels 40 out of the view plane of FIG. 1 in order to provide a high current capability. In one embodiment, substrate 12 is formed with n-type monocrystalline silicon, and transistor 10 is an n-channel device specified to operate at a drain to source voltage of at least thirty volts and a drain current $I_{DS}$ of at least 0.5 amperes. In another embodiment, transistor 10 is formed as a planar device with its drain electrode at the top surface to form a lateral DMOS device.

A sublayer 13 is formed at a bottom surface 18 of substrate 12, and is heavily doped so that transistor 10 operates with a low on resistance. In one embodiment, sublayer 13 has an n-type conductivity and a doping concentration of about $10^{19}$ atoms/centimeter$^3$. In an alternate embodiment, sublayer 13 has a p-type conductivity for configuring transistor 10 as an insulated gate bipolar transistor.

An epitaxial layer 14 is formed over sublayer 13 with a doping concentration selected to provide a desired breakdown voltage. Epitaxial layer 14 typically is lightly to moderately doped, has a thickness in a range between about two micrometers and about fifty micrometers and a doping concentration in a range between about $10^{14}$ and about $5*10^{16}$ atoms/centimeter$^3$. In one embodiment, epitaxial layer 14 has an n-type conductivity and a thickness of about three micrometers and a doping concentration of about $2*10^{16}$ atoms/centimeter$^3$. Epitaxial layer 14 and sublayer 13 function as a common drain of transistor 10.

Well region 15 is formed at top surface 19 and into epitaxial layer 14 with a doping profile selected to provide a predetermined conduction threshold of transistor 10. In one embodiment, well region 15 has a p-type conductivity, a depth of about one micrometer, and a surface doping concentration of about $5*10^{17}$ atoms/centimeter$^3$. Well region 15 is electrically interconnected at surface 19 with other well regions 19 out of the view plane of FIG. 1.

A source region 16 is formed at top surface 19 and into well region 15 for electrically coupling to two channels 40 formed in well region 15. Source regions 16 are heavily doped to provide a low on resistance of transistor 10. In one embodiment, source regions 16 are formed to have an n-type conductivity, a depth of about 0.2 micrometers, and a doping concentration of about $10^{20}$ atoms/centimeter$^3$.

A gate dielectric 22 is formed over surface 19 to support an electric field that inverts underlying portions of well regions 15 to form channels 40. Gate dielectric 22 typically is formed with a thickness in a range between about seventy-five angstroms and about one thousand angstroms, depending on the specified conduction threshold and/or breakdown voltage. In one embodiment, gate dielectric 22 is formed as a thermally grown silicon dioxide having a thickness of about four hundred angstroms.

A gate electrode 25 is formed with a conductive material over regions of gate dielectric 22 to receive a control signal that modulates the conduction of channels 40. In one embodiment, gate electrode 25 is formed with polycrystalline silicon heavily doped to provide a low resistance. In one embodiment, gate electrode 25 is formed with an n-type conductivity and is deposited to a thickness of about 0.65 micrometers. Discrete portions of gate electrode 25 are connected together out of the view plane.

The conduction threshold voltage of transistor 10 is a function of both the doping concentration of well region 15 and the thickness of gate dielectric 22. The conduction threshold increases as the thickness of gate dielectric 22 increases and the surface doping concentration of well region 15 increases. The conduction threshold voltage decreases as either the thickness of gate dielectric 22 or the doping concentration of well region 15 decreases. In one embodiment, the conduction threshold voltage of transistor 10 is selected to be about 1.5 volts.

A dielectric region 20 is formed over surface 19 between adjacent portions of gate dielectric 22 as shown. Dielectric region 20 is made thicker than gate dielectric 22 in order to increase the spacing between epitaxial layer 14 and gate electrode 25, thereby reducing the corresponding component of the drain to gate capacitance of transistor 10. Dielectric region 20 typically is formed with a thickness ranging between about two thousand angstroms and about ten thousand angstroms, depending on the specified breakdown voltage. In one embodiment, dielectric region 20 is formed by patterning and etching a deposited or thermally grown silicon dioxide film whose thickness is about six thousand angstroms. Dielectric region 20 is shown as having substantially vertical sidewalls, but may also be formed using any of a number of standard etch steps to provide sloped sidewalls for better step coverage.

Note that dielectric region 20 overlies an edge 23 of well region 15, and consequently also overlies channel 40. As a result, the vertical separation between gate electrode 25 and epitaxial region 14 is at all points determined by the thickness of dielectric region 20 rather than by gate dielectric 22. This arrangement achieves a lower drain to gate capacitance and higher switching speed than what is provided by other devices.

Since dielectric region 20 overlaps edge 23, the dielectric film overlying channels 40 is thicker over one portion, i.e., due to region 20, than over the remaining portion, i.e., due to gate dielectric 22. Because dielectric region 20 is substantially thicker than gate dielectric 22, the portion of channel 40 underlying dielectric region 20 would otherwise have a higher threshold. However, well region 15 has a lower doping concentration at edge 23 than its concentration adjacent to source region 16 due to the out diffusion of well region 15 dopants during fabrication. The lower doping concentration offsets any increase attributable to the thickness of dielectric region 20, so a substantially uniform conduction threshold is maintained along the entire length of channels 40. Hence, the overlap of channels 40 by dielectric region 20 provides transistor 10 with a higher switching speed and/or higher frequency response without degrading its conduction threshold voltage. In one embodiment, channel 40 has a length of about 0.8 micrometers and region 20 overlies channels 40 by about 0.2 micrometers without altering the conduction threshold of transistor 10.

A dielectric layer 27 is formed over gate electrode 25 and other regions for electrical isolation from subsequent metallization interconnect layers. In one embodiment, dielectric layer 27 is formed with silicon dioxide deposited to a thickness of about six thousand angstroms.

A metal interconnect film is deposited over surfaces of transistor 10 and patterned to form a source electrode 28 as shown. Source electrode 28 also connects other source regions 16 and well regions 15 out of the view plane of FIG. 1. In one embodiment, source electrode 28 has a thickness of about three micrometers. A region of the metal film outside of the view plane is used to form a gate terminal for interconnecting gate electrodes 25.

A metal layer is formed on bottom surface 18 to form a drain electrode 42 for externally routing drain current $I_{DS}$ flowing through channels 40. In one embodiment, drain electrode 42 is about three micrometers thick.

Figure 2:
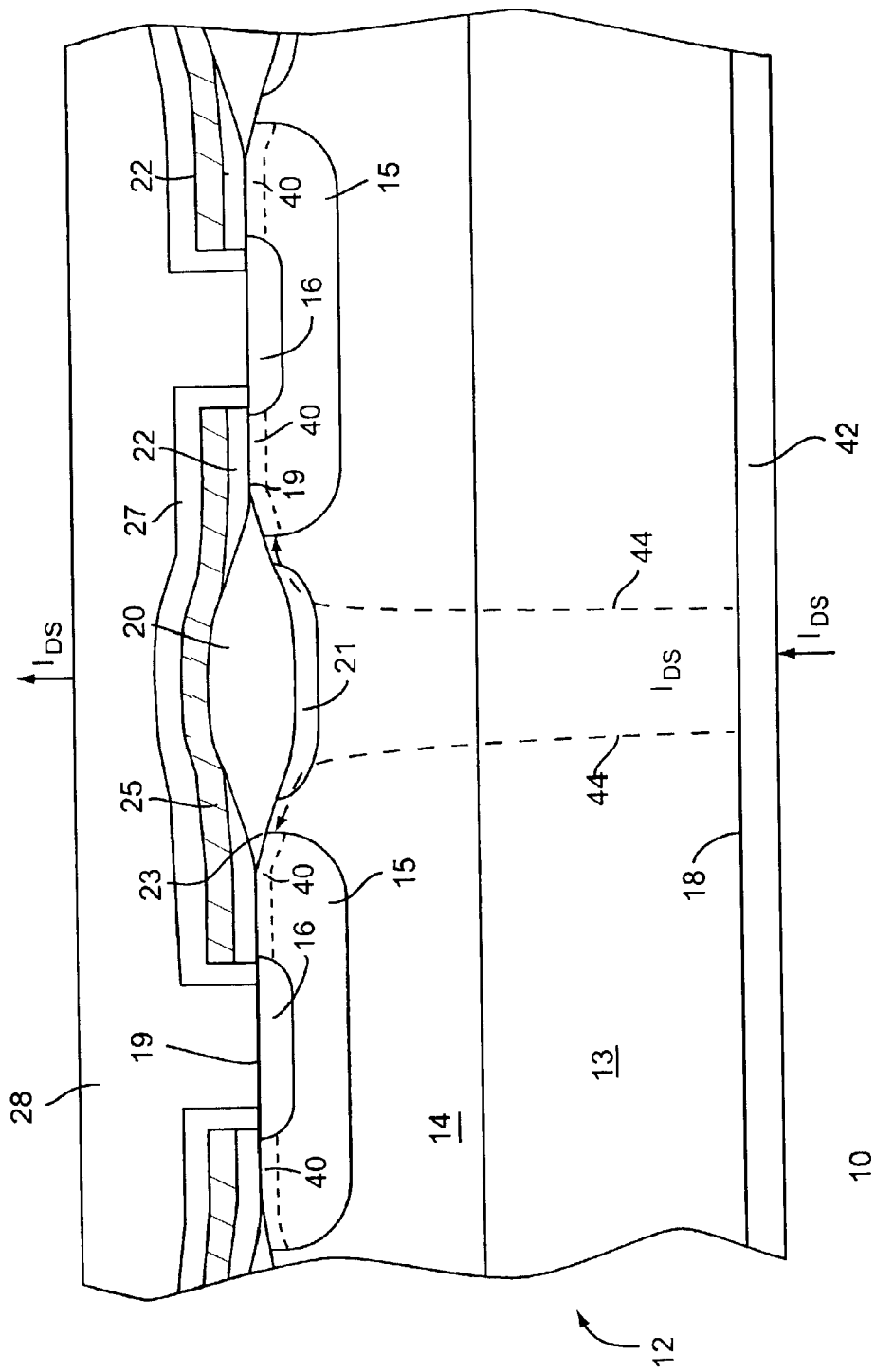
FIG. 2 is a cross-sectional view of the transistor in an alternate embodiment.

FIG. 2 is a cross-sectional view of transistor 10 in an alternate embodiment. Transistor 10 has a similar structure and operation to what was described previously, except that dielectric region 20 is partially recessed below top surface 19.

In this alternate embodiment, dielectric region 20 is formed using a standard locally oxidized semiconductor (LOCOS) or similar process. In one such process, an exposed portion of epitaxial layer 14 is thermally oxidized through an opening in a hard mask (not shown) made of, for example, silicon nitride. A drain enhancement region 21 is formed by implanting n-type dopants into the opening to increase the local conductivity of epitaxial region 14, thereby reducing the on resistance of transistor 10 and disabling a parasitic junction field-effect transistor of transistor 10. After the n-type dopants are implanted, a thermal oxidation process converts the exposed semiconductor material to a semiconductor oxide, e.g., silicon dioxide, whose volume exceeds that of the consumed semiconductor material. The exposed semiconductor material is consumed to form a lower portion of dielectric region 20 below surface 19 and an upper portion above surface 20 as shown.

During the thermal oxidation process, oxygen diffuses under the edges of the hard mask to oxidize semiconductor material and form a tapered "bird's beak" feature around the perimeter of dielectric region 20. The combination of a tapered topography and an at least partially recessed film provides a relatively planar surface that facilitates good step coverage so that overlying films such as gate electrode 25 are highly conformal, with little or no thinning and a consequent high reliability. Hence, dielectric region 20 avoids steep vertical steps while providing a thicker film that results in a low drain to gate capacitance. In one embodiment, dielectric region 20 is formed to a peak thickness of about seven thousand angstroms.

The tapered edges also allow dielectric region 20 to extend over well region 15 a greater distance than with other embodiments. Hence, a greater portion of channels 40 can be formed with an overlying dielectric thickness greater than the thickness of gate dielectric 22 without altering the effective conduction threshold of transistor 10. In one embodiment where the length of channels 40 is about 0.8 micrometers, dielectric region 20 overlies channels 40 by a distance of about 0.3 micrometers.

In summary, the present invention provides a vertical DMOS transistor with a reduced drain to gate capacitance and a higher switching speed and frequency response. The transistor is formed in a semiconductor substrate that has a first surface for forming a channel and a second surface for forming a drain electrode so that a channel current is routed between the first and second surfaces. A gate dielectric has a first thickness and overlies a first portion of the channel. A dielectric film overlies a second portion of the channel and has a second thickness different from, e.g., greater than, the first thickness. The increased thickness increases the switching speed and frequency response of the transistor, thereby increasing its efficiency by reducing power dissipation and improving reliability.

What is claimed is:

1. A power switching device comprising:
   a semiconductor substrate having a first conductivity type, wherein the semiconductor substrate forms a drain region;
   a well region formed at a horizontal top surface of the semiconductor substrate to provide a substantially horizontal channel for the power switching device, wherein the well region has a first edge;
   a source region of the first conductivity type formed in the well region;
   a gate dielectric layer formed on the semiconductor substrate and over a portion of the well region, wherein the gate dielectric layer comprises a first thickness;
   a dielectric region formed on the semiconductor substrate, wherein the dielectric region comprises a second thickness greater than the first thickness, and wherein a tapered edge of the dielectric region overlaps the first edge; and a drain enhancement region formed in the semiconductor substrate adjacent to the dielectric region and spaced apart from the well region.

2. The power switching device of claim 1 wherein the dielectric region comprises a LOCOS dielectric region.

3. The power switching device of claim 2 wherein the LOCOS dielectric region overlies the substantially horizontal channel by a distance of about 0.3 micrometers.

4. The power switching device of claim 1 wherein the dielectric region overlaps the first edge by about 0.3 micrometers.

5. The power switching device of claim 1 wherein the well region has a first surface doping concentration adjacent the first thickness and a second surface doping concentration adjacent the second thickness, wherein the first surface doping concentration is greater than the second surface doping concentration.

6. A semiconductor device comprising
a semiconductor substrate having a first conductivity type, wherein the semiconductor substrate forms a drain region;
a well region formed at a top surface of the semiconductor substrate to provide a horizontal channel for the semiconductor device, wherein the well region has a first edge at the channel;
a source region of the first conductivity type formed in the well region;
a gate dielectric layer formed on the semiconductor substrate and over a portion of the well region, wherein the gate dielectric layer comprises a first peak thickness; and
a dielectric region having tapered edges formed on the semiconductor substrate, wherein the dielectric region comprises a second peak thickness greater than the first thickness, and wherein a tapered edge of the dielectric region overlaps the first edge at the channel thereby lowering gate to drain capacitance of the semiconductor device without substantially altering effective conduction threshold.

7. The semiconductor device of claim 6 wherein the tapered edge of the dielectric region overlies the first edge by a distance of about 0.3 micrometers.

8. The semiconductor device of claim 6 further comprising a drain enhancement region formed in the semiconductor substrate adjacent to the dielectric region and spaced apart from the well region.

* * * * *